(12) United States Patent
Polakovic et al.

(10) Patent No.: US 11,885,009 B2
(45) Date of Patent: Jan. 30, 2024

(54) METHOD OF MAKING THIN FILMS

(71) Applicant: UCHICAGO ARGONNE, LLC, Chicago, IL (US)

(72) Inventors: Tomas Polakovic, Chicago, IL (US); Valentine Novosad, Lemont, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 0 days.

(21) Appl. No.: 16/274,202

(22) Filed: Feb. 12, 2019

(65) Prior Publication Data

US 2020/0255936 A1    Aug. 13, 2020

(51) Int. Cl.
| | | |
|---|---|---|
| *C23C 14/34* | (2006.01) | |
| *C23C 14/46* | (2006.01) | |
| *C23C 14/06* | (2006.01) | |
| C23C 14/08 | (2006.01) | |

(52) U.S. Cl.
CPC .......... *C23C 14/46* (2013.01); *C23C 14/0641* (2013.01); *C23C 14/08* (2013.01); *C23C 14/3407* (2013.01)

(58) Field of Classification Search
CPC . C23C 14/46; C23C 14/0641; C23C 14/3407; C23C 14/08; C23C 14/0676
USPC .................................................. 204/192.11
See application file for complete search history.

(56) References Cited

U.S. PATENT DOCUMENTS

| | | | |
|---|---|---|---|
| 3,600,218 A | | 8/1971 | Pennebaker |
| 5,122,252 A | * | 6/1992 | Latz .................... C23C 14/0052 |
| | | | 204/192.12 |
| 5,270,263 A | | 12/1993 | Kim et al. |
| 6,425,987 B1 | * | 7/2002 | Lee ..................... C23C 14/0031 |
| | | | 204/192.11 |
| 6,454,910 B1 | | 9/2002 | Zhurin et al. |
| 8,147,972 B2 | | 4/2012 | Veerasamy |
| 2002/0072475 A1 | * | 6/2002 | Michaluk .................. C22B 5/04 |
| | | | 505/100 |
| 2002/0197509 A1 | * | 12/2002 | Carcia ....................... G03F 1/54 |
| | | | 428/689 |
| 2006/0008656 A1 | * | 1/2006 | Veerasamy ....... B32B 17/10761 |
| | | | 428/434 |

OTHER PUBLICATIONS

Lin et al. "Ion-beam Deposition of NbCN Thin Films For Microelectronic Applications", IEEE Transactions On Magnetics, vol. Mag-23, No. 2, Mar. 1987, 839-842. (Year: 1987).*

Track et al. "Dual Ion-Beam Deposition of Superconducting NbN Films", Advances in Cryogenic Engineering Materials, New York, 1986, pp. 635-641. (Year: 1986).*

(Continued)

*Primary Examiner* — Rodney G McDonald
(74) *Attorney, Agent, or Firm* — MARSHALL, GERSTEIN & BORUN LLP

(57) ABSTRACT

A method of making a thin film can include bombarding a substrate with first ions supplied from a first ion beam; and sputtering from a metal sputtering target substantially simultaneously with the bombardment to deposit a metal-ion film onto the substrate, wherein the method is performed without applied heat, and the metal sputtering target comprises one or more of a metal, a transition metal, a semi-metal, alloys thereof and combinations thereof.

14 Claims, 5 Drawing Sheets

(56) References Cited

OTHER PUBLICATIONS

Guziewicz et al., "Technology of Ultrathin NbN and NbTiN Films for Superconducting Photodetectors", Acta Physica Polonica A, vol. 120, No. 6-A, pp. A-76-A-79, (2011). (Year: 2011).*
Pichon et al. "Zirconium nitrides deposited by dual ion beam sputtering: physical properties and growth modeling", Applied Surface Science 150 (1999) 115-124. (Year: 1999).*
Sharma et al. "X-ray photoelectron spectroscopy studies on AlN thin films grown by ion beam sputtering in reactive assistance of N+/N2+ions: Substrate temperature induced compositional variations", Thin Solid Films 636 (2017) pp. 626-633. (Year: 2017).*
Polakovic et al. "Room temperature deposition of superconducting niobium nitride films by ion beam assisted sputtering", APL Mater. 6, (Jul. 2018). (Year: 2018).*
Abadias "Stress and preferred orientation in nitride-based PVD coatings" Surface & Coating Technology 202 (2008) 2223-2235. (Year: 2008).*
Orgiazzi "Packaging and Characterization of NbN Superconducting Nanowire Single Photon Detectors", Thesis, 2009. (Year: 2009).*
Smidt, F. A. "Use of ion beam assisted deposition to modify the microstructure and properties of thin films." *International Materials Reviews* 35.1 (1990): 61-128.
V.N. Zhitomirsky, Structure and mechanical properties of vacuum arc-deposited NbN coatings, Thin Sold Films, Elsevier, p. 134-142, Aug. 4, 1998.

\* cited by examiner

METHOD OF MAKING THIN FILMS

STATEMENT OF GOVERNMENT SUPPORT

This is invention was made with support under grant number DE-AC02-06CH11357 awarded by the Department of Energy. The U.S. Government has certain rights in this invention.

BACKGROUND

Field of the Disclosure

The disclosure relates to an ion-beam assisted sputtering method for depositing a film on a substrate and more particularly to a method of depositing a film by bombarding the film with ions from an ion beam substantially simultaneously with sputtering from a sputtering target.

Brief Description of Related Technology

Conventional fabrication methods for manufacturing superconducting films includes reactive sputtering or CVD and thermal diffusion, each of which requires depositing the materials at elevated temperatures, generally more than 500° C. High temperatures are used to avoid the presence of multiple crystal structures, which are not all superconducting, particularly in the case of depositing niobium nitride (NbN). This makes such processes incompatible with lift-off processes, heterostructures with materials sensitive to heat or fabrication junctions, where impurity diffusion leads to interaction at the junction interface. While there exist processes capable of achieving high $T_c$ NbN films at room temperature, such as incorporation of methane gas with rf diode sputtering, they lead to films with a granular or columnar void structure, as indicated by their normal state resistivity well above 150 µΩ·cm or require precise control over relative concentrations of sputtering gasses and large sputtering powers, which leads to substrate heating.

SUMMARY

In accordance with embodiments, a method of making a superconducting transition metal nitride film includes bombarding a substrate with nitrogen ions supplied from an ion beam; and sputtering from a transition metal target substantially simultaneously with the bombardment to deposit a transition metal nitride film onto the substrate. In embodiments, the method is performed at ambient temperature. In embodiments, the method is performed in the absence of applied heat. In embodiments, the transition metal target comprises a transition metal and/or transition metal alloy.

In accordance with embodiments, a method of making a film on a substrate includes bombarding the substrate with ions supplied from an ion beam and sputtering from a sputtering target substantially simultaneously with the bombardment to deposit a sputtering target-ion film on the substrate, wherein the sputtering target comprises a metal, transition metal, semi-metal, alloys thereof, and combinations thereof. In embodiments, the method is performed at ambient temperature. In embodiments, the method is performed in the absence of applied heat. In embodiments the ions are one or more of nitrogen, ammonia, methane, and oxygen.

In accordance with embodiments, a method of making a film on a substrate includes bombarding the substrate with first ions supplied from a first ion beam and second ions supplied form a second ion beam, and sputtering from a sputtering target substantially simultaneously with the bombardment to deposit a film on the substrate. In embodiments, the first and second ions are nitrogen and oxygen, respectively, or vice versa, and the film is an oxynitride.

In accordance with embodiments, a method of making a film on a substrate includes bombarding the substrate with first ions supplied from a first ion beam and sputtering from a first sputtering target and from a second sputtering target substantially simultaneously with the bombardment to deposit mixed metal or semi-metal film on the substrate. In embodiments, the method first includes bombarding the substrate with second ions supplied from a second ion beam simultaneously with the bombardment with the first ions.

In accordance with embodiments, a method of making a layered film on a substrate includes a first step of bombarding the substrate with first ions supplied from a first ion beam and sputtering from a sputtering target substantially simultaneously with the bombardment to deposit a first layer on the substrate and a second step of bombarding the substrate with second ions supplied from a second ion beam and sputtering from the sputtering target substantially simultaneously with the bombardment to deposit a second layer on the first layer. In embodiments, the method is repeated with any suitable number of ions or mixture of ions to achieve the desired number of layers. In embodiments, the method is performed in an entirely closed system, forming all layers in the closed system.

In accordance with embodiments, a method of making a layered film on a substrate includes a first step of bombarding the substrate with first ions supplied from a first ion beam and sputtering from a first sputtering target substantially simultaneously with the bombardment to deposit a first layer on the substrate and a second step of bombarding the substrate with first or second ions supplied from the first or a second ion beam and sputtering from a second sputtering target substantially simultaneously with the second bombardment to deposit a second layer on the first layer. In embodiments, the method is repeated with any suitable number of ions or mixture of ions and/or any suitable number of different sputtering targets in any sequence or alternation to achieve the desired number and composition of layers. In embodiments, the method is performed in an entirely closed system, forming all layers in the closed system. In embodiments, the closed system includes all sputtering targets used in the method present in the chamber from the start of the process.

BRIEF DESCRIPTION OF THE DRAWINGS

In FIG. 2, the top most line corresponds to ion beam assisted sputtering (IBAS), the line below, in the top portion of the image, corresponds to reactive sputtering (RS). Error bars denote the 90%-10% transition width and trend lines are polynomial fits;

DETAILED DESCRIPTION

Figure 1:
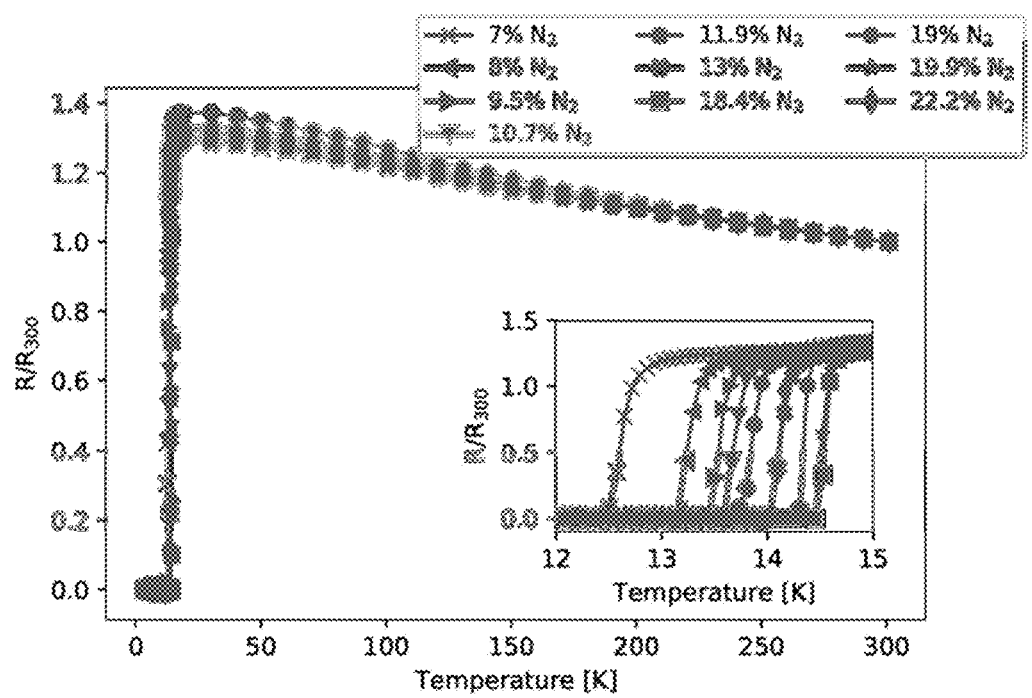
FIG. 1 is a graph showing the normalized resistance as a function of temperature for 240 nm thick films made in accordance with embodiments of the disclosure at various $N_2$ concentrations.

In embodiments, a method of depositing a thin film on a substrate can include sputtering from a sputtering target in the presence of reactive ions supplied from an ion beam. In embodiments, the method includes depositing a superconducting metal nitride thin film onto a substrate by bombar0ding a substrate with nitrogen ions supplied from an ion beam while sputtering from a transition metal target to deposit a transition metal nitride film onto the substrate. In embodiments, the method includes depositing a metal and/or semi-metal oxide thin film onto a substrate by bombarding the substrate with oxygen ions supplied from an ion beam while sputtering from a metal or semi-metal target to deposit a metal and/or semi-metal oxide. In embodiments, multiple sputtering targets and/or alloyed sputtering targets can be used. In embodiments, multiple ion beams and/or ion beam sources can be used. Other target materials, combinations of target materials, ions, and ion combinations can be used in various embodiments as discussed in detail below.

In various embodiments, a working gas is present during deposition. In embodiments, the working gas is an inert gas. In various embodiments, there is no external heat applied during the deposition process.

It has been advantageously found that the ion beam assisted sputtering method in accordance with embodiments of the disclosure can allow for deposition of a thin film onto a variety of substrates, including non-epitaxial substrates. Further, advantageously, because the process can be performed in the absence of external heating, films can be deposited on heat sensitive substrates. In embodiments, residual heat can be generated from the sputtering process. In such embodiments, the residual heat is minimal and generally does not result in a significant increase in temperature. In some embodiments, the substrate can be cooled during the deposition process to account for any heating resulting from the sputtering process. In embodiments, films of superconducting materials, magnetic materials, supermagnetic materials, dielectric materials, and materials having optical properties can be formed.

In embodiments, the method is performed in sputtering chamber under vacuum. In embodiments, the sputtering chamber is an ultra-high vacuum chamber. In embodiments, the method is performed in a chamber at a pressure of about 1 mTorr to about 10 mTorr, about 1 mTorr to about 5 mTorr, about 1 mTorr to about 3 mTorr, about 2 mTorr to about 4 mTorr, about 5 mTorr to about 10 mTorr. For example, the pressure can be about 1, 1.5, 2, 2.5, 3, 3.5, 4, 4.5, 5, 5.5, 6, 6.5, 7, 7.5, 8, 8.5, 9, 9.5, and 10 mTorr. In embodiments the pressure is 2.5 mTorr. Other pressures can also be contemplated herein depending on the sputtering and ion beam systems utilized.

In embodiments, the method is performed in the presence of a working gas. In embodiments, the working gas is a non-reactive gas. In embodiments, the working gas is a noble gas. For example, the working gas can be one or more of argon, xenon, neon, radon, helium, and krypton. In embodiments, the working gas is selected to avoid gas molecules from being entrapped in the deposited film. In other embodiments, the working gas can be selected to purposefully become entrapped in the deposited film to generate voids or defects in the film. In such embodiments, the voids or defects can render the films suitable for uses as sensor applications, for example, as gas sensors.

In embodiments, the sputtering target can be selected based on the desired film composition. For example, in embodiments the sputtering target can be a transition metal or transition metal alloy. For example, the transition metal sputtering target can be one or more of niobium, titanium, molybdenum, tantalum, tungsten, hafnium, zirconium, combinations thereof, and alloys thereof. In embodiments, the sputtering target is or comprises niobium having a purity of 99.9999%.

In embodiments, the sputtering target can be a metal, transition metal, semi-metal, alloys thereof and combinations thereof. In such embodiments, the sputtering target can be referred to herein as a "metal sputtering target" and shall be understood to encompass sputtering target that include metals, transition metals, semi-metals, alloys, and combinations thereof. For example, the metal sputtering target can include one or more of silicon, aluminum, niobium iron, titanium, zirconium, and zinc, and combinations thereof, and alloys thereof.

In embodiments, the method can include sputtering from an alloy target and/or from multiple targets to deposit a film having two different metals on the substrate. In embodiments, the method can include sputtering from two or more sputtering targets simultaneously or substantially simultaneously. For example, in embodiments, the sputtering target can be a niobium alloy. In embodiments, the sputtering target can be a titanium alloy. For example, in embodiments the sputtering target can be a niobium-titanium alloy.

In embodiments, the method can include sputtering while supplying multiple ions from multiple ion beams. For example, in embodiments, ion beams can supply both nitrogen and oxide during the sputtering process to provide a metal and/or semi-metal oxynitride. Other combinations of ions are also contemplated herein. When multiple ion beams are utilized in methods of the disclosure, the ion beams can have the same or different energies.

Various sputtering sources can be used as is known in the art. For example, the sputtering source can be DC magnetron, pulsed, RF, high impulse, and others known in the art.

In embodiments, the sputtering can be performed at an energy density of about 10 W/in$^2$ to 50 W/in$^2$, about 15 W/in$^2$ to about 45 W/in$^2$, about 20 W/in$^2$ to about 50 W/in$^2$, about 10 W/in$^2$ to about 30 W/in$^2$. Other suitable amounts include about 10, 15, 20, 25, 30, 35, 40, 45, and 50 W/in$^2$. In embodiments, lower sputtering rates can be utilized for improved process control.

In embodiments, the energy of the ion beam (or ion beams where multiple beams are used) can be about 50 eV to about 400 eV per ion. For example, in embodiments, the energy of the ion beam can be about 50 eV to about 400 eV per N$_2$. Other suitable ion beam energy can be about 50 eV to about 350 eV, about 100 eV to about 200 eV, about 50 eV to about 150 eV, about 100 eV to about 300 eV, about 150 eV to about 400 eV. Other suitable ion beam energy includes about 50, 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 395, and 400 eV per ion. In embodiments, the ion beam energy is about 100 eV to about 200 eV per $N_2$.

In embodiments, the substrate is or comprises one or more of silicon, aluminum nitride, partially epitaxial aluminum nitride, tantalum nitride, titanium oxide (amorphous, heavy metal), electron hafnium oxide. In embodiments, the substrate is a silicon wafer. In embodiments, the substrate is a non-epitaxial substrate. In embodiments, the substrate is an oxide. In embodiments, the substrate is a polymeric substrate. In an embodiment, the substrate is or includes a polyimide film. In embodiments, the substrate is or includes Kapton (DuPont). It has been advantageously found that the method in accordance with embodiments of the disclosure, can allow uniform or substantially uniform films, such as transition metal oxides, nitrides, and oxynitrides, can be grown on a variety of substrates with uniformity in composition and thickness. Films can be uniform in one or more of composition, crystal structure, crystal orientation, and thickness. In embodiments the films can have higher densities as compared to films generated by other methods, such as reactive sputtering techniques. This can be particularly advantageous, for example, in allowing formation of high performing films on substrates suitable for a variety of electronic devices, such as wearable devices. Further, it can allow for a wider variety of substrates and the ability to reduce costs by allowing non-epitaxial substrates to be utilized.

In embodiments, the substrates can have non-planar surfaces and/or three-dimensional features. Advantageously, methods of the disclosure can allow for uniform or substantially uniform deposition on such substrates, including three-dimensional features. This can allow for forming high performing films on a variety of substrates to form interconnects, cross-over, and cross-under structures. In embodiments, substrate can include microtexture and the resulting thin film can conform to the microtexture.

Additionally, in embodiments, there is no heat applied during the process. In embodiment, residual heating may result from the sputtering process. In such embodiments and/or in temperature sensitive embodiments, the substrate can be cooled during the deposition process. For example, water cooling or other cooling systems known in the art can be used during the deposition process to maintain a desired substrate temperature. In embodiments, the temperature of the system does not exceed 60° C. as a result of residual heating. In embodiments, the temperature during deposition can be about 23° C. to about 60° C.

The ion concentration supplied from the ion beam during sputtering can be selected based on the desired film structure, the sputtering target, and the desired film properties. In embodiments, the ion can be supplied during sputtering at a concentration of about 5% to about 50%, about 10% to about 50%, about 25% to about 50%, about 5% to about 25%, about 5% to about 10%, about 7% to about 15%, and about 10% to about 25%. Other suitable concentrations can include about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, and 50%. In embodiments, nitrogen is supplied at the foregoing concentrations. It has been advantageously found that a wider operating range of ion concentration can be used in embodiments of the disclosure as compared to conventional reactive ion sputtering in which the ions are supplied in the working gas. For example, it has been found that more uniform ion concentration on the resulting thin film can be obtained with methods of the disclosure, with less variation across the thin film from edge to center, which can be problematic with conventional processes.

In embodiments, the sputtering target can be spaced about 1 in to about 10 in from the substrate, about 1 in to about 5 in, about 3 in to about 8 in, and about 5 in to about 10 in. Other suitable distances include about 1, 2, 3, 4, 5, 6, 7, 8, 9, 10 inches.

In embodiments, the sputtering target can be angled relative to the substrate. The angle can be selected to achieve a desired orientation of the thin film. For example, in embodiments, the sputtering target can be angled, relative to the substrate, about 0° to about 90°, about 25° to about 40°, about 15° to about 50°, about 20° to about 35°. Other suitable angles include about 0, 5, 10, 15, 20, 25, 30, 35, 40, 45, 50, 55, 60, 65, 70, 75, 80, 85, and 90°. In embodiments, the sputtering target is angled about 33° relative to the substrate.

In embodiments, the method can further include cleaning the substrate prior to depositing the thin film. A variety of cleaning processes can be used as are known in the art. For example, in embodiments, the substrate can be cleaned using a low energy argon ion beam.

In embodiments, methods of the disclosure can be used to produce films having a thickness of about 1 nm to tens of microns. Thicker coatings on the order of microns can be useful, for example, as protective coatings. In embodiments, the thickness can be about 1 nm to about 90 microns, about 1 nm to about 10 nm, about 100 nm to about 500 nm, about 500 nm to about 1 micron, about 10 microns to 30 microns, about 10 microns to about 80 microns, and about 1 micron to about 15 microns. Thickness can be selected based on desired needed and are not particularly limited herein.

In embodiments, the film is a transition metal nitride having superconducting properties. In embodiments, the superconducting $T_c$ of the resulting superconducting film is the same as or substantially similar to that of a single crystal of the material despite the thin film having grain boundaries. In embodiments, the thin film is niobium nitride and the superconducting $T_c$ is greater than 13K. Advantageously, methods of the disclosure can allow for quality superconducting properties to be achieved without required heating during the process, thereby allowing the deposition on to a wider variety of substrates, including heat sensitive substrates. Conventional deposition processes typically require temperatures in excess of 600° C. to achieve superconducting $T_c$ close to that of a single crystal.

In embodiments, the thin film can be a niobium nitride thin film having a resistivity as low as 110 μΩ.

In embodiments, method of the disclosure can include forming layered structures. For example, layers can have the same or different composition. In embodiments, the layered structure can be formed using a single sputtering target with alternating application of different ion beam sources. For example, in embodiments, a silicon sputtering target can be used with alternating application of a nitrogen ion beam and an oxygen ion beam to generate a layered structure having silicon oxide and silicon nitride. Any combinations of layers can be used with any number of sputtering targets and ion beam sources. Advantageously, layered deposition can be achieved in a closed system in accordance with embodiments of the disclosure, which can result in clean interfaces Such layered deposition cannot be achieved with conventional reactive sputtering systems because of the requiring of precondition the target with the reactive gas prior to deposition of the film. Such precondition is not required in embodiments of the method of the disclosure.

In embodiments, a layered structure can be formed using multiple sputtering targets with one or more ion beam sources. For example, the sputtering targets can be engaged alternatingly or in any desired sequence to deposit different layers of the film structure. The alternating or sequence of engagement of sputtering can be done with a single ion source or multiple ion sources, which can be engaged alternatingly or simultaneously. Any combination and number of ion sources and sputtering targets can be used. For example, in embodiments, the process can include sputtering from 1 to 5 sputtering targets and one or more ion sources. Any suitable number of targets can be used herein and will be understood to be limited only the sputtering equipment used. In embodiments, multiple layers can be deposited from multiple sputtering targets in an entirely closed system—that is in a single chamber, engaging the sputtering targets without having to manipulate the contents of the chamber.

EXAMPLES

Example

NbN films were prepared in accordance with an embodiment of the disclosure in a commercial high vacuum sputtering system from Angstrom Engineering. After transferring the substrate through a load-lock, the chamber was pumped down to less than $5\times10^{-8}$ Torr before commencing the deposition process. Prior to deposition, the substrates were cleaned by low energy argon ion beam. The substrates were Si substrates with native oxide.

Sputtering was carried out at 2 mTorr with $Ar_2$ (99.9999% purity) as a working gas. Nitrogen was supplied through the ion gun, an End-Hall ion gun. The amount of argon and nitrogen was controlled by mass flow controllers. The sputtering target was 99.9999% pure Nb, 3 inches in diameter and was powered at 0.18 kW from a DC power source. Sputtering rates were determined by a quartz thickness monitor, which was calibrated from thickness determined by X-ray reflectivity. Neutralization of nitrogen ions was achieved by thermionic emission of electrons from a hollow cathode. The ion gun was operated in constant gas flow mode to facilitate comparison with reactive sputtering, while discharge and emission currents and voltages were kept constant during deposition. The energy of the ion beam was kept to a value of 100 eV per $N_2$ in order to minimize damage to the thin film. Total ion beam current under these conditions was measured as 0.5 A. There was no intentional heating during deposition. Self-heating due to sputtering did not exceed 55° C., as determined by a calibrated thermal couple built into the substrate holder assembly.

Comparative Example—Reactive Sputtering

NbN films were deposited using reactive sputtering carried out in the same chamber at equivalent conditions as the ion-beam assisted sputtering of example 1. As with Example 1, after transferring the substrate through a load-lock, the chamber was pumped down to less than $5\times10^{-8}$ Torr before commencing the deposition process. Prior to deposition, the substrates were cleaned by low energy argon ion beam. The substrates were Si substrates with native oxide.

Sputtering was carried out at 2 mTorr with $Ar_2$ (99.9999% purity) as working gas and $N_2$ (99.9997% purity) gas was mixed into the working gas. Monitoring of residual and sputtering gasses was done by a quadrupole gas analyzer. The sputtering target was 99.9999% pure Nb, 3 inches in diameter and was powered at 0.18 kW from a DC power source. Sputtering rates were determined by a quartz thickness monitor, which was calibrated from thickness determined by X-ray reflectivity.

Results

The superconducting Tc and residual resistivity ratio were measured using the standard four probe technique and temperature dependent measurements were carried out in a Quantum Design PPMS. Resistive transitions of 240 nm thick NbN films deposited on the Si substrate of Example 1 are shown in FIG. 1.

Figure 2:
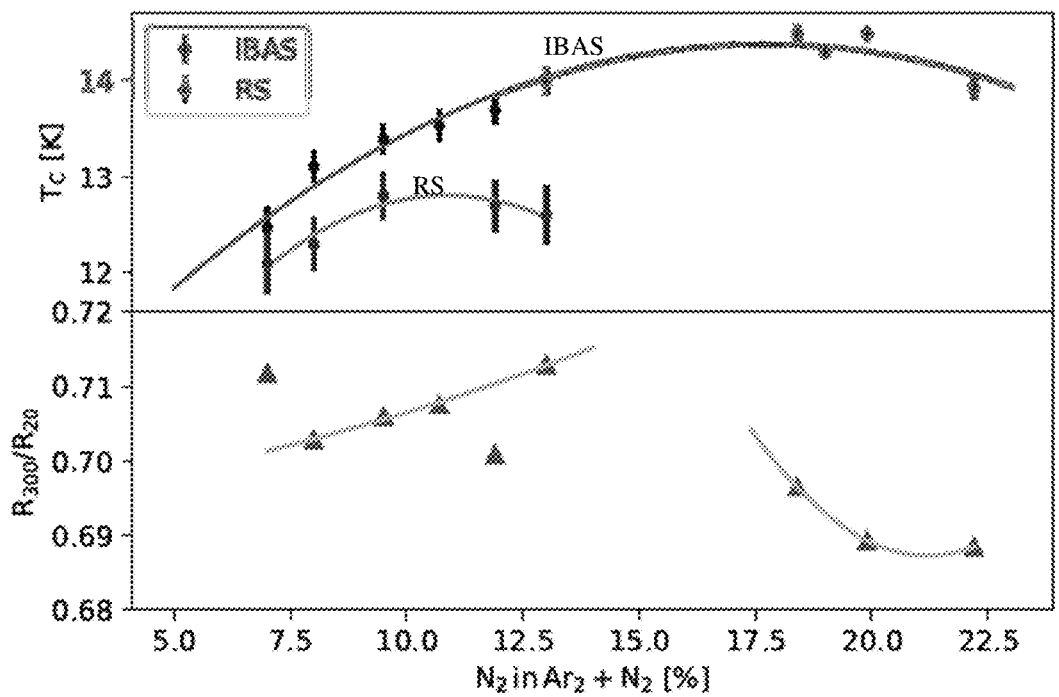
FIG. 2 is a graph showing the dependence of superconducting $T_C$ (top) and the residual resistance ratio (bottom) of 240 nm thick films on nitrogen concentration, the films being made in accordance with embodiments of the disclosure.

FIG. 2 illustrates the transition temperatures plotted as a function of nitrogen concentration and provides a comparison of the thin films produced in Example 1 to the comparative example. The superconducting Tc peaks and transition width minimized as the NbN film approached optimal stoichiometry. However, a quantitative difference was found when comparing the thin films produced by the method of Example 1, in accordance with the disclosure, to the comparative example. There is a significant difference in the maximum value of the superconducting TC, where the samples of Example 1 reach values of 14.5 K, indicating close to optimal stoichiometry of the film grains. By comparison, the maximum value of the superconducting Tc of the comparative example only reach values of about 12.7 K.

Example 1 also demonstrated that methods in accordance with the disclosure had a decrease in process sensitivity towards the concentration of nitrogen. Superconducting $T_C$ greater than 14K was achievable in a range of nitrogen concentrations from 13% to 22%, which is a significantly larger processing window available for reactive sputtering, where high superconducting Tc is only obtainable in a window of approximately 2%.

Room temperature resistivity of the thin film of Example 1 was determined as 35.26±2.1 µΩ·cm.

Figure 3A:
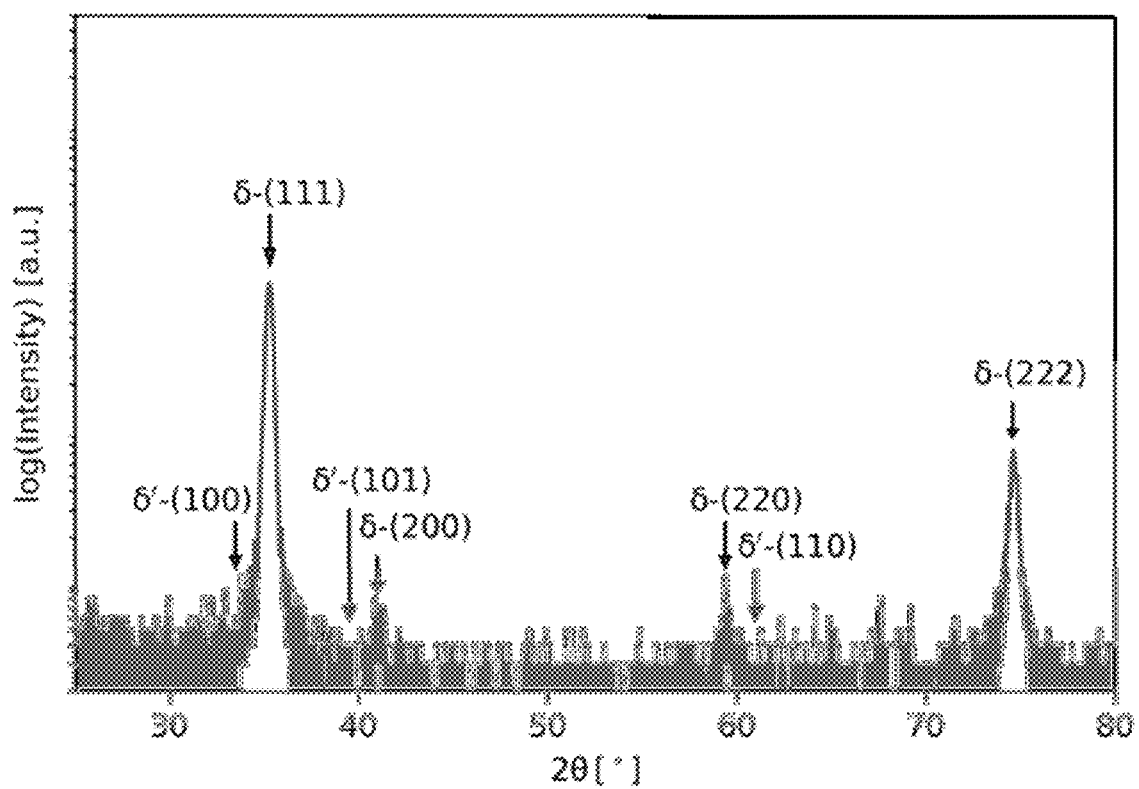
FIG. 3A is an X-ray diffraction pattern of a 500 nm NbN film deposited in accordance with embodiments of the disclosure. All visible diffraction peaks correspond to cubic δ-NbN.
Figure 3B:
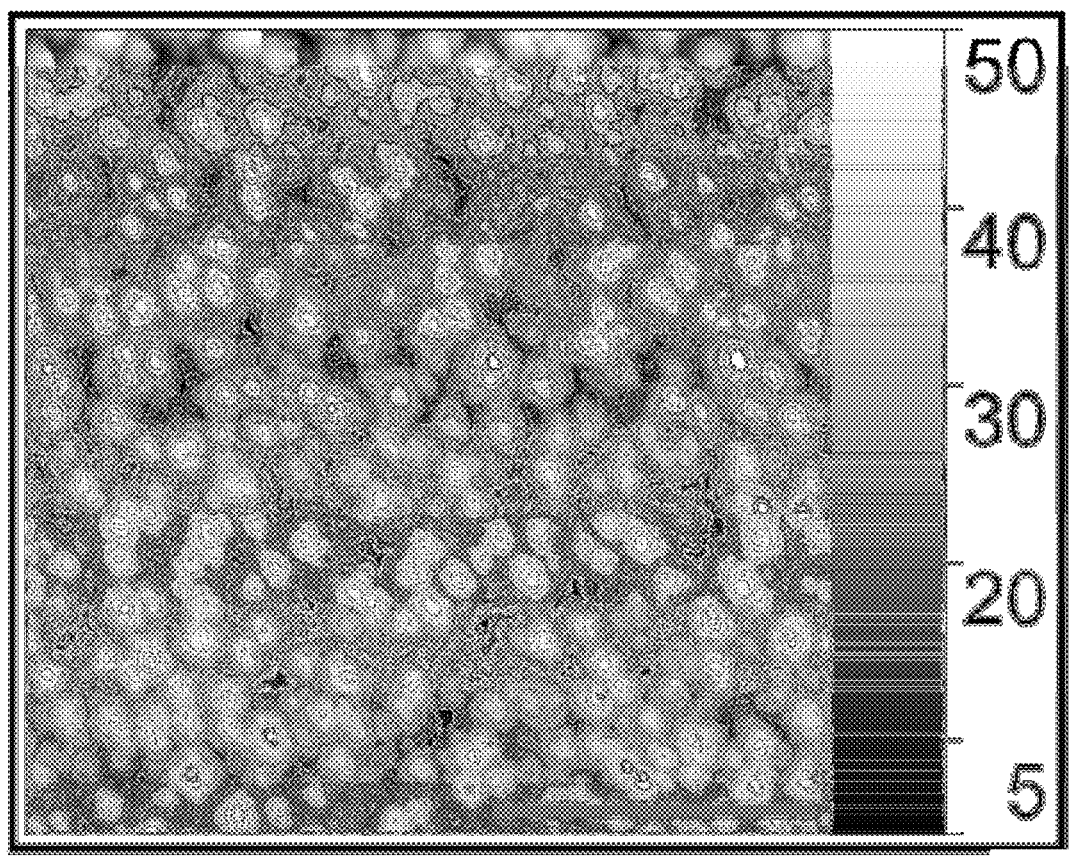
FIG. 3B is an atomic force microscopy image of the 500 nm NbN film of FIG. 3A.

FIG. 3 illustrates X-ray diffraction measurements of thin films produced in Example 1, confirming close to optimal stoichiometry being achieved for the high-Tc phase. The films were textured films containing predominantly the cubic δ-NbN phase, without the presence of the non-superconducting hexagonal δ'-NbN phase. The superconducting Tc of the films of Example 1 were lower than that of single crystal NbN, which can be attributed to the effects of grain boundaries suppressing local density states, leading to reduced total Tc, even if intragrain Tc would be close to maximum. This was further corroborated by the residual resistivity ratios RRR=R300/R20, which were all less than 1, an effect attributed to grain boundary scattering of conduction electrons. Referring to FIG. 2, the RRR correlates with superconducting Tc, reaching a maximum value of about 0.72. This RRR can be correlated to an average grain size of approximately 25 nm, which was confirmed with XRD (determined to be 22.55 nm) and AFM (mean grain width of 28.9).

Figure 4:
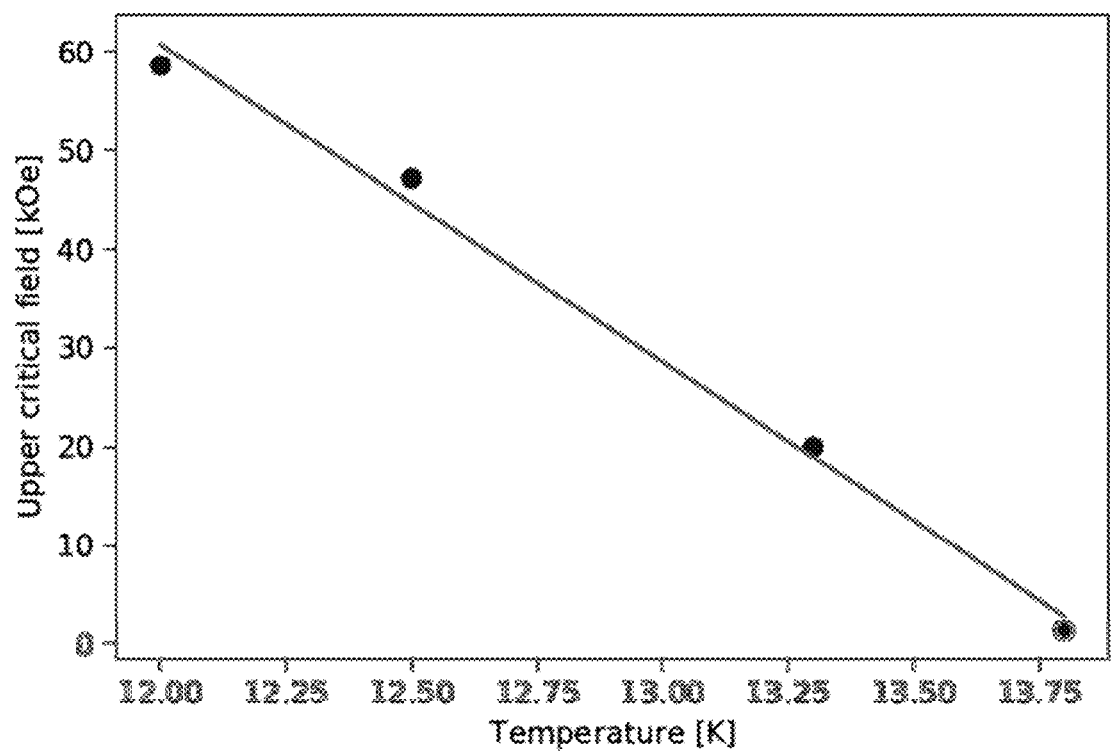
FIG. 4 is a graph showing the perpendicular upper critical field $H_{C2}$ measured as a function of temperature for a 240 nm thin film deposited in accordance with embodiments of the disclosure.

Magnetization measurements were carried out at various fields close to superconducting $T_C$ to determine upper critical magnetic field and coherence length. The temperature dependent $H_{c2}(T)$ was deifned as field where magnetization reached zero. Referring to FIG. 4, from the upper critical fields measured, the extroplated perpendicular critical field was determined to be $H_{c2}(0)=319$ kOe and the estimated coherence length was ξ=3.21 nm.

Figure 5A:
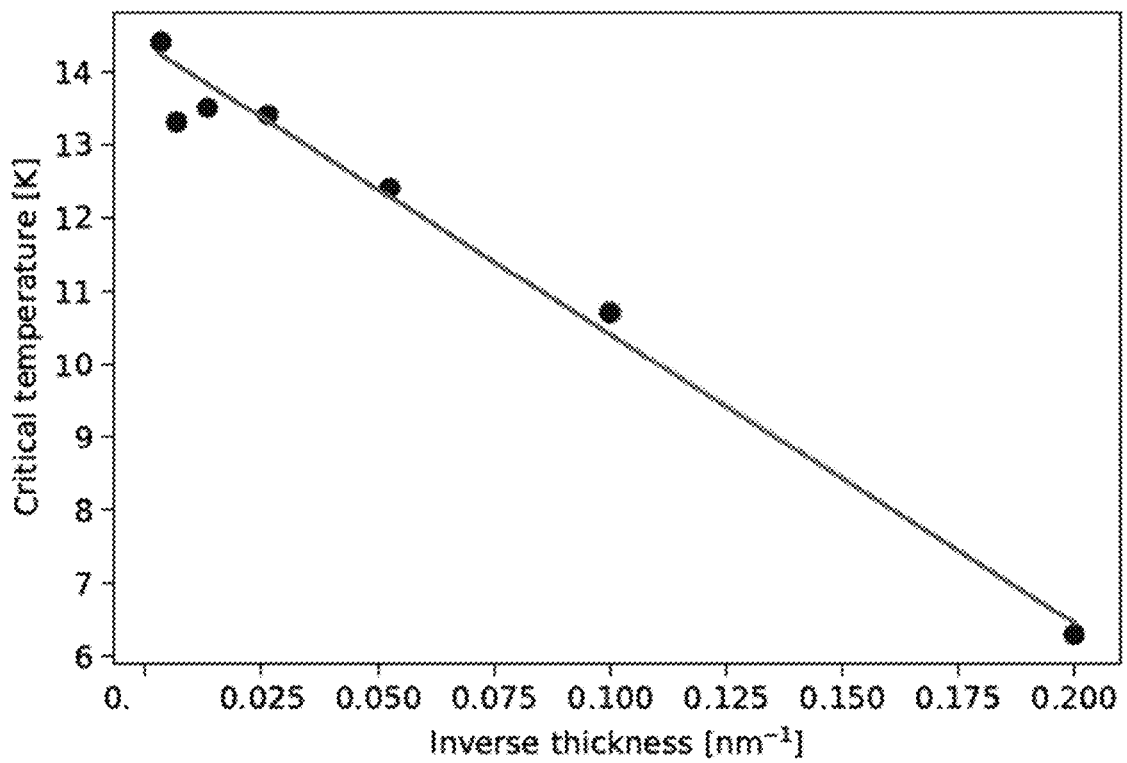
FIG. 5A is a graph showing the linear dependence of superconducting $T_C$ on inverse film thickness.
Figure 5B:
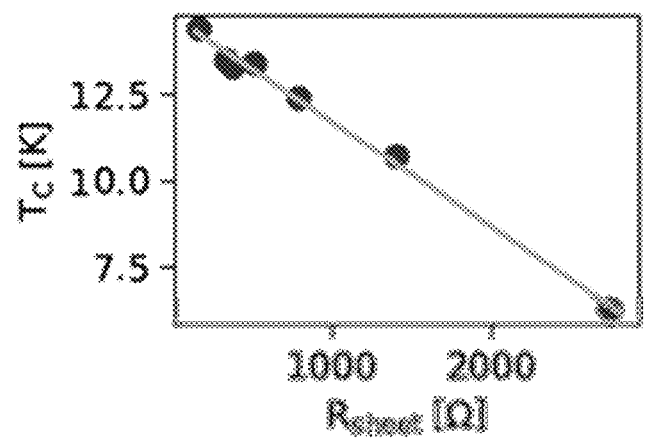
FIG. 5B is a graph showing the dependence of superconducting $T_C$ on film sheet resistance at 20 K.

FIG. 5A illustrates the dependence of superconducting $T_C$ on inverse film thickness, and FIG. 5B illustrate the dependence on superconducting $T_C$ on film sheet resistance at 20 K. From this data, it was determined that the critical thickness of a superconducting thin film made by the method of Example 1 is 2.7 nm. This is comparable to the approximate coherence length $\xi=3.21$ nm, and was used to determine the Thomas-Fermi screening length to be $a\approx0.4$ nm.

As compared to the films of the comparative example, films made by Example 1 were found to demonstrate an increase in superconducting $T_C$, as well as a significant decrease in sensitivity to nitrogen concentration. This can beneficially lead to more consistent results at large-scale fabrication. Further, good superconducting properties were demonstrated by the films of Example 1 even on non-lattice matching substrates.

The use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Still further, the figures depict embodiments for purposes of illustration only. One of ordinary skill in the art will readily recognize from the following discussion that alternative embodiments of the structures and methods illustrated herein may be employed without departing from the principles described herein.

Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed:

1. A method of making a superconducting transition metal nitride film, comprising:
   bombarding a substrate with ions consisting of nitrogen ions supplied from an ion beam; and
   sputtering by magnetron sputtering from a transition metal target using a noble gas as a working gas, wherein the sputtering is performed substantially simultaneously with the bombarding to thereby deposit a transition metal nitride film onto the substrate, wherein
   the method is performed without applied heat and at temperature less than 60° C.;
   the ion beam has an energy in a range of 50 eV to 400 eV per $N_2$;
   the sputtering is performed at an energy density of about 10 W/in$^2$ to about 50 W/in$^2$;
   the transition metal target comprises a transition metal and/or a transition metal alloy,
   the ions consisting of nitrogen ions are supplied only from the ion beam; and
   the superconducting transition metal nitride film is substantially uniform in one or more of crystal structure and crystal orientation.

2. The method of claim 1, wherein the transition metal target comprises one or more of Nb, Mo, Ta, W, Hf, Zr, alloys thereof, and combinations thereof.

3. The method of claim 1, wherein the transition metal target is Nb having a purity of 99.9999%.

4. The method of claim 1, wherein the transition metal target is spaced about 1 inch to about 10 inches from the substrate.

5. The method of claim 1, wherein the transition metal target is angled about 0° to about 90° relative to the substrate.

6. The method of claim 1, wherein the working gas is one or more of argon, neon, xenon, and krypton.

7. The method of claim 1, wherein the substrate is non-epitaxial.

8. A method of making a layered thin film, comprising:
   forming a first layer comprising:
     bombarding a substrate with first ions supplied from a first ion beam; and
     sputtering by magnetron sputtering from a first metal sputtering target substantially simultaneously with the bombarding with the first ions supplied from the first ion beam to deposit a first metal-first ion thin film onto the substrate,
   forming a second layer comprising:
     bombarding the substrate with second ions supplied from a second ion beam while sputtering by magnetron sputtering from the first metal sputtering target, the bombarding with the second ions being performed after the bombarding with the first ions to form a layered structure of the first metal-first ion film and the first metal-second ion film, or
     a further bombarding with first ions from the first ion beam, and sputtering from a second metal sputtering target substantially simultaneously with the further bombarding to deposit a second metal-first ion film onto the first metal-first ion film, the second metal sputtering target comprising one or more of metals,
   wherein:
   the method is performed in a single chamber as a closed system,
   the bombarding and the sputtering are performed at a temperature less than 60° C. and in the presence of a non-reactive working gas as the only gas;
   the first ions and the second ions, when present, consist of nitrogen, oxygen, ammonia, or any combination thereof and are only supplied through the respective one of the first or second ion beam;
   the first ion beam and the second ion beam, when present, each has an energy in a range of 50 eV to 400 eV per ion;
   the sputtering is performed at an energy density of about 10 W/in$^2$ to about 50 W/in$^2$;
   the first metal sputtering target comprises niobium, aluminum, tungsten, alloys thereof or combinations thereof, and
   one or both of the first layer and second layer comprises a superconducting transition metal film and the superconducting transition metal film is substantially uniform in one or more of crystal structure and crystal orientation.

9. The method of claim 8, wherein the first ions are nitrogen and the second ions are oxygen, and the layered structure is a first metal nitride film having a first metal oxide film disposed thereon; or
   wherein the first ions are oxygen and the second ions are nitrogen, and the layered structure is a first metal oxide film having a first metal nitride film disposed thereon.

10. The method of claim 8, wherein the one or more metals comprises one or more transition metals, semi-metals, alloys thereof, and combinations thereof.

11. A method of forming a superconducting transition metal thin film, comprising:
   bombarding a substrate with first ions supplied from a first ion beam;

sputtering by magnetron sputtering from a first metal sputtering target substantially simultaneously with the bombarding of the first ion beam to deposit a thin film onto the substrate; and bombarding the substrate with second ions supplied from a second ion beam, the second ions being supplied simultaneously with the first ions, wherein:

the bombarding and the sputtering are performed at a temperature less than 60° C. and in the presence of a non-reactive working gas as the only gas;

the first ions consist of nitrogen, oxygen, ammonia, or any combination thereof and the first ions are supplied only from the first ion beam;

the first ion beam has an energy in a range of 50 eV to 400 eV per ion, the sputtering is performed at an energy density of about 10 W/in$^2$ to about 50 W/in$^2$, the first metal sputtering target comprises niobium, aluminum, tungsten, alloys thereof or combinations thereof, and the superconducting transition metal film is substantially uniform in one or more of crystal structure and crystal orientation.

12. The method of claim 11, wherein the first ions consist of nitrogen.

13. The method of claim 12, wherein the second ions consist of oxygen, ammonia, and any combination thereof.

14. The method of claim 11, wherein the first ions are nitride and the second ions are oxygen, and the thin film is a metal oxynitride.

* * * * *